United States Patent
Cody et al.

(10) Patent No.: US 11,075,078 B1
(45) Date of Patent: Jul. 27, 2021

(54) METHOD FOR MAKING A SEMICONDUCTOR DEVICE INCLUDING A SUPERLATTICE WITHIN A RECESSED ETCH

(71) Applicant: Atomera Incorporated, Los Gatos, CA (US)

(72) Inventors: Nyles Wynn Cody, Tempe, AZ (US); Keith Doran Weeks, Chandler, AZ (US); Robert John Stephenson, Duxford (GB); Richard Burton, Phoenix, AZ (US); Yi-Ann Chen, Campbell, CA (US); Dmitri Choutov, Sunnyvale, CA (US); Hideki Takeuchi, San Jose, CA (US); Yung-Hsuan Yang, San Jose, CA (US)

(73) Assignee: ATOMERA INCORPORATED, Los Gatos, CA (US)

(*) Notice: Subject to any disclaimer, the term of this patent is extended or adjusted under 35 U.S.C. 154(b) by 0 days.

(21) Appl. No.: 16/810,957

(22) Filed: Mar. 6, 2020

(51) Int. Cl.
*H01L 21/02* (2006.01)
*H01L 29/78* (2006.01)
(Continued)

(52) U.S. Cl.
CPC .. *H01L 21/02507* (2013.01); *H01L 21/02304* (2013.01); *H01L 21/762* (2013.01);
(Continued)

(58) Field of Classification Search
CPC ..... H01L 21/76224–76237; H01L 21/823481; H01L 21/823878; H01L 21/76202–76221; H01L 21/76235; H01L 2027/11833; H01L 21/762; H01L 21/02019; H01L 21/30604–30621;
(Continued)

(56) References Cited

U.S. PATENT DOCUMENTS 4,914,743 A * 4/1990 Yoder ............... H01L 21/30621
257/192
4,937,204 A 6/1990 Ishibashi et al.
(Continued)

FOREIGN PATENT DOCUMENTS

GB 2347520 6/2000

OTHER PUBLICATIONS

U.S. Appl. No. 16/176,005; filed Oct. 31, 2018 Weeks et al.
(Continued)

*Primary Examiner* — Scott B Geyer
(74) *Attorney, Agent, or Firm* — Allen, Dyer, Doppelt + Gilchrist, P.A.

(57) ABSTRACT

A method for making a semiconductor device may include forming an isolation region adjacent an active region in a semiconductor substrate, and selectively etching the active region so that an upper surface of the active region is below an adjacent surface of the isolation region and defining a stepped edge therewith. The method may further include forming a superlattice overlying the active region. The superlattice may include stacked groups of layers, with each group of layers comprising stacked base semiconductor monolayers defining a base semiconductor portion, and at least one non-semiconductor monolayer constrained within a crystal lattice of adjacent base semiconductor portions.

24 Claims, 12 Drawing Sheets

(51) Int. Cl.
*H01L 21/762* (2006.01)
*H01L 29/15* (2006.01)
*H01L 29/10* (2006.01)

(52) U.S. Cl.
CPC ............ *H01L 29/105* (2013.01); *H01L 29/15* (2013.01); *H01L 29/7842* (2013.01)

(58) Field of Classification Search
CPC ... H01L 21/32133–32139; H01L 21/465–467; H01L 21/02587–02609; H01L 21/02505–02507; H01L 29/1041; H01L 29/105; H01L 29/1054; H01L 29/15–158; H01L 29/7842; H01L 29/7847; H01L 29/7849; H01L 29/78687
See application file for complete search history.

(56) References Cited

U.S. PATENT DOCUMENTS

| | | |
|---|---|---|
| 5,216,262 A | 6/1993 | Tsu |
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 * | 4/2020 | Chen ................. H01L 27/1469 |
| 2003/0012925 A1 * | 1/2003 | Gorrell ............... H01L 27/0605 428/137 |
| 2003/0034529 A1 | 2/2003 | Fitzgerald et al. |
| 2003/0057416 A1 | 3/2003 | Currie et al. |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2008/0012004 A1 | 1/2008 | Huang et al. |
| 2008/0258134 A1 | 10/2008 | Mears et al. |
| 2011/0215299 A1 | 9/2011 | Rao |
| 2013/0099283 A1 * | 4/2013 | Lin ....................... H01L 29/785 257/190 |
| 2015/0145002 A1 * | 5/2015 | Lee ................... H01L 29/66575 257/192 |
| 2015/0187927 A1 * | 7/2015 | Wang .............. H01L 21/823892 438/303 |
| 2015/0357414 A1 | 12/2015 | Mears |
| 2016/0149023 A1 | 5/2016 | Mears et al. |
| 2016/0197146 A1 * | 7/2016 | Augusto ......... H01L 31/035236 257/22 |
| 2016/0358773 A1 | 12/2016 | Mears et al. |
| 2018/0358361 A1 | 12/2018 | Rao |
| 2019/0057896 A1 | 2/2019 | Stephenson et al. |
| 2019/0058059 A1 | 2/2019 | Stephenson et al. |
| 2019/0189652 A1 | 6/2019 | Chen et al. |
| 2019/0279869 A1 | 9/2019 | Weeks et al. |
| 2019/0279897 A1 | 9/2019 | Stephenson et al. |
| 2019/0280090 A1 | 9/2019 | Stephenson et al. |
| 2019/0317277 A1 | 10/2019 | Stephenson |
| 2019/0319135 A1 | 10/2019 | Stephenson |
| 2019/0319136 A1 | 10/2019 | Stephenson |

(56) References Cited

U.S. PATENT DOCUMENTS

2019/0319167 A1   10/2019   Stephenson
2020/0075731 A1   3/2020    Weeks et al.

OTHER PUBLICATIONS

U.S. Appl. No. 16/192,897; filed Nov. 16, 2018 Connelly et al.
U.S. Appl. No. 16/192,911; filed Nov. 16, 2018 Takeuchi et al.
U.S. Appl. No. 16/192,923; filed Nov. 16, 2018 Takeuchi et al.
U.S. Appl. No. 16/192,987; filed Nov. 16, 2018 Takeuchi et al.
U.S. Appl. No. 16/193,000; filed Nov. 16, 2018 Takeuchi et al.
U.S. Appl. No. 16/193,011; filed Nov. 16, 2018 Takeuchi et al.
U.S. Appl. No. 16/513,528 ; filed 17/17/2019; Burton et al.
U.S. Appl. No. 16/513,832; filed 17/17/2019 Burton et al.
U.S. Appl. No. 16/513,845 ; filed 17/17/2019 Burton et al.
U.S. Appl. No. 16/513,875; filed 17/17/2019 Burton et al.
U.S. Appl. No. 16/513,895; filed 17/17/2019 Burton et al.
U.S. Appl. No. 16/513,906; filed 17/17/2019 Burton et al.
U.S. Appl. No. 16/513,932; filed 17/17/2019 Burton et al.
U.S. Appl. No. 16/513,943; filed 17/17/2019 Burton et al.
U.S. Appl. No. 16/801,287; filed Feb. 26, 2020.
U.S. Appl. No. 16/801,305; filed Feb. 26, 2020.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.
R. Tsu "Si Based Green ELD: Si-Oxygen Superlattice" wysiwyg:// \/http://www3.interscience.wiley.com/cgi-bin/abstract/72512946/ start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
Reichel et al. "SiGe channels for V T control of high-k metal gate transistors for 32 nm complementary metal oxide semiconductor technology and beyond" Thin Solid Films: www.elsevier.com/locate/tsf: 520 (2012) 3170-3174.

* cited by examiner

METHOD FOR MAKING A SEMICONDUCTOR DEVICE INCLUDING A SUPERLATTICE WITHIN A RECESSED ETCH

TECHNICAL FIELD

The present disclosure generally relates to semiconductor devices and, more particularly, to method for making semiconductor devices including advanced semiconductor materials.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming an isolation region adjacent an active region in a semiconductor substrate, and selectively etching the active region so that an upper surface of the active region is below an adjacent surface of the isolation region and defining a stepped edge therewith. The method may further include forming a superlattice overlying the active region. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions.

In one example embodiment, forming the superlattice may include forming the superlattice to a height of the stepped edge, although in other embodiments the superlattice may be formed to a height slightly above or slightly below the height of the stepped edge. By way of example, etching may comprise in-situ etching with an HCl etchant. More particularly, etching may be for a period in a range of 10 to 250 seconds, for example. In an example implementation, etching may be to a depth of less than or equal to 400 Å.

In accordance with another example implementation, etching may include ex-situ etching with a wet etch comprising a photoresist developer. By way of example, the photoresist developer may comprise tetramethylammonium hydroxide (TMAH). In an example embodiment, etching may be at a temperature in a range of 840-860° C.

The method may further include forming spaced-apart source and drain regions on the semiconductor substrate with the superlattice defining a channel therebetween, and a gate overlying the superlattice. By way of example, the base semiconductor monolayers may comprise at least one of silicon and germanium, and the at least one non-semiconductor monolayer may comprise at least one of oxygen, nitrogen, fluorine, carbon and carbon-oxygen.

DETAILED DESCRIPTION

Figure 1:
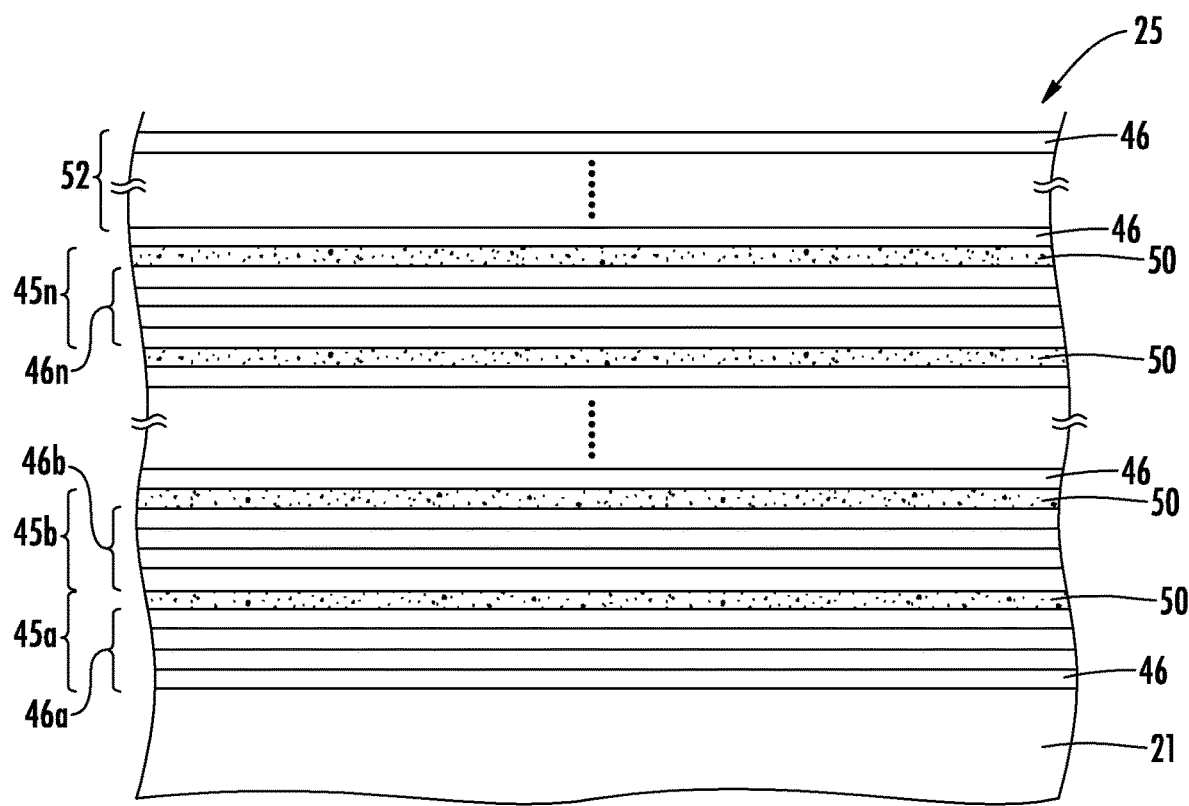
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to methods for making semiconductor devices having an enhanced semiconductor superlattice therein. The enhanced semiconductor superlattice may also be also referred to as an "MST" layer or "MST technology" in this disclosure and the accompanying drawings.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
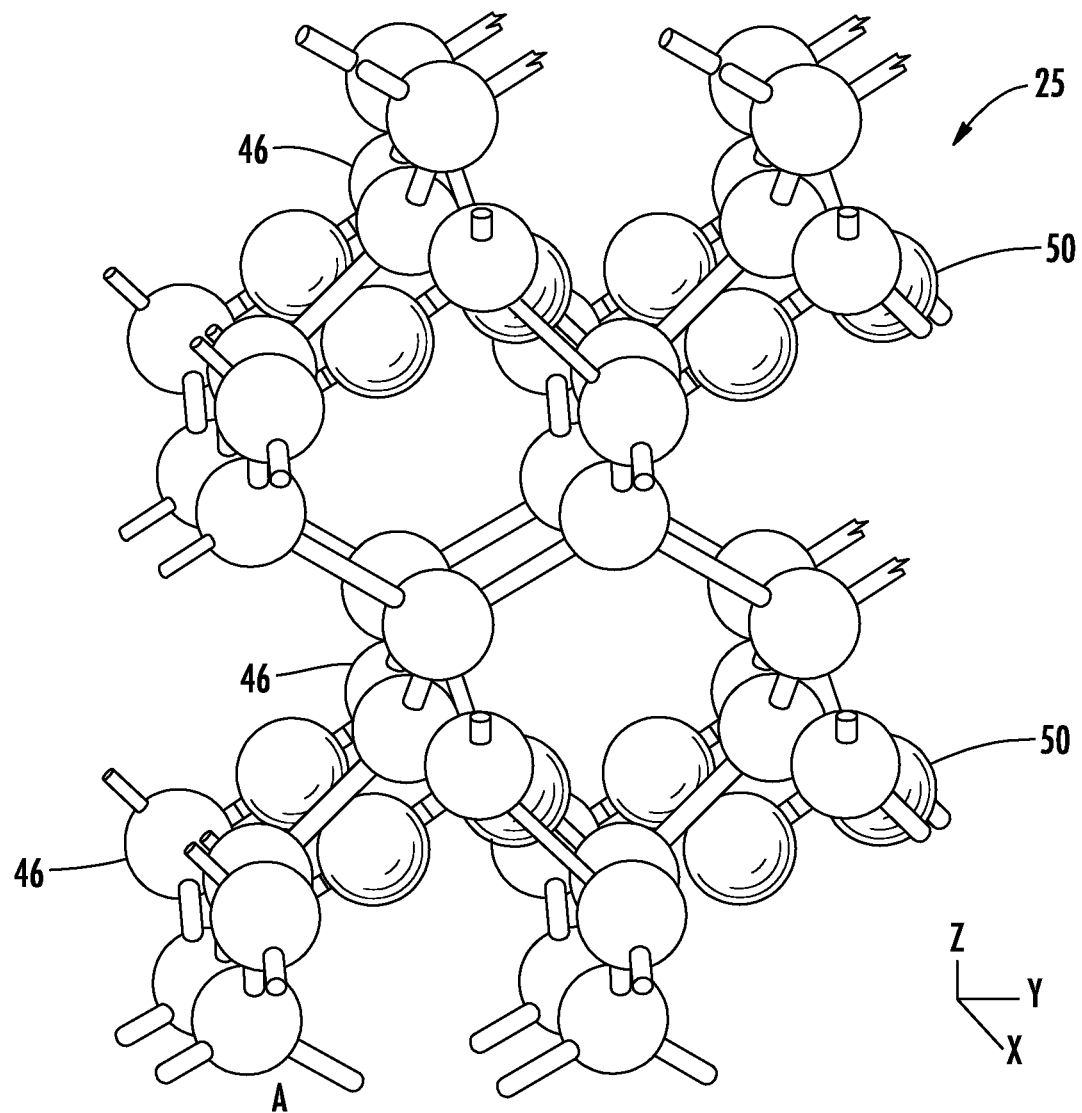
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation on a substrate 21, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
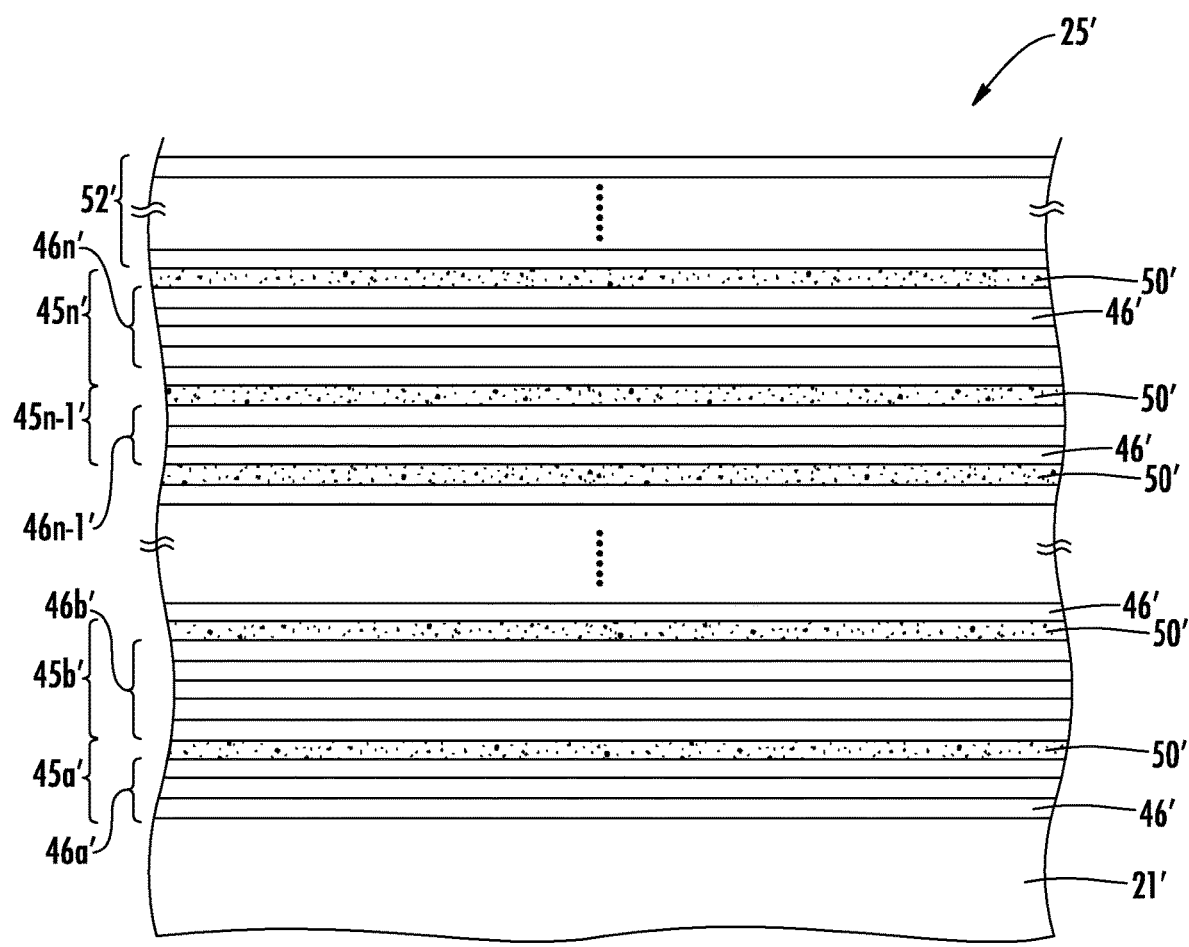
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
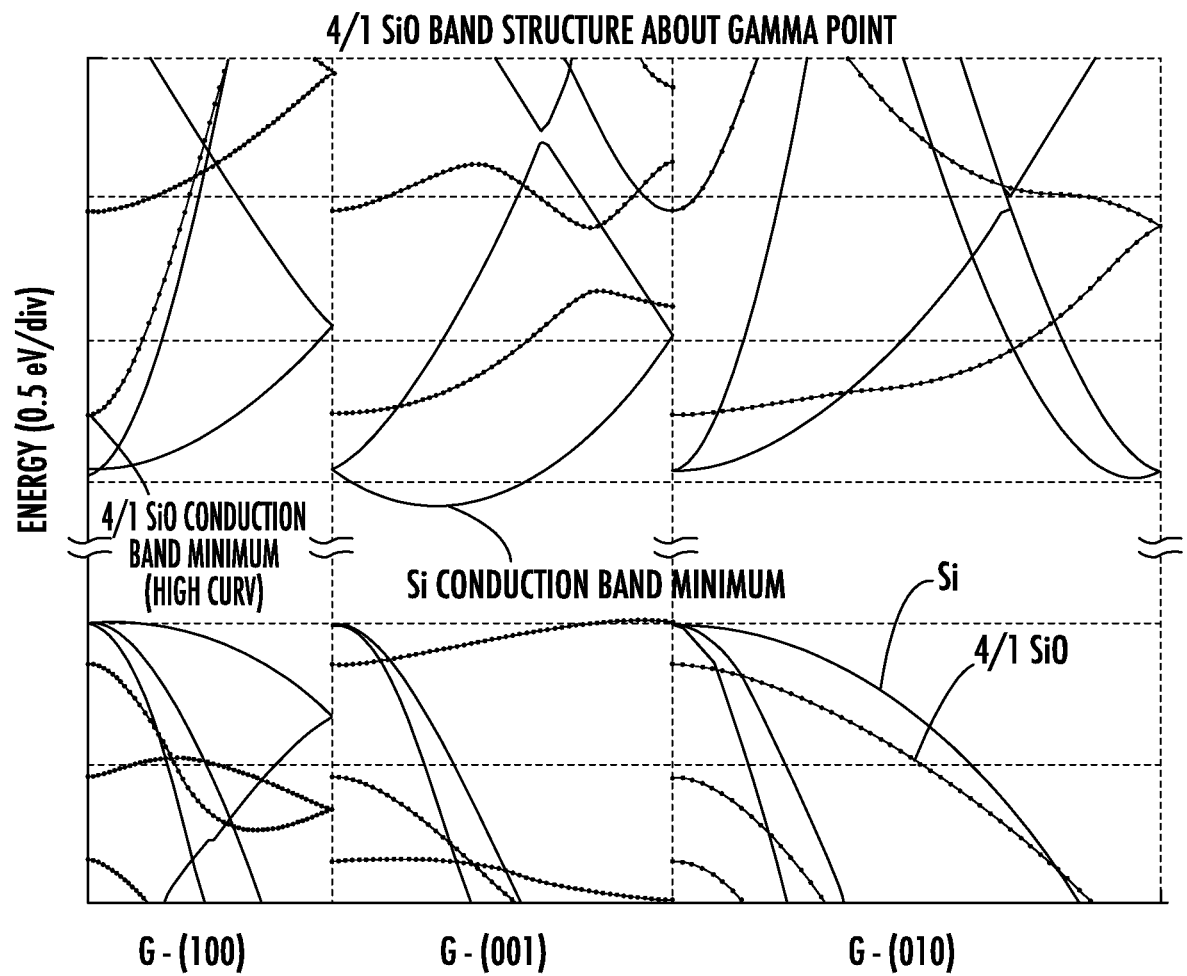
FIG. 4A is a graph of the calculated band structure from the gamma point (G) for both bulk silicon as in the prior art, and for the 4/1 Si/O superlattice as shown in FIGS. 1-2.
Figure 4B:
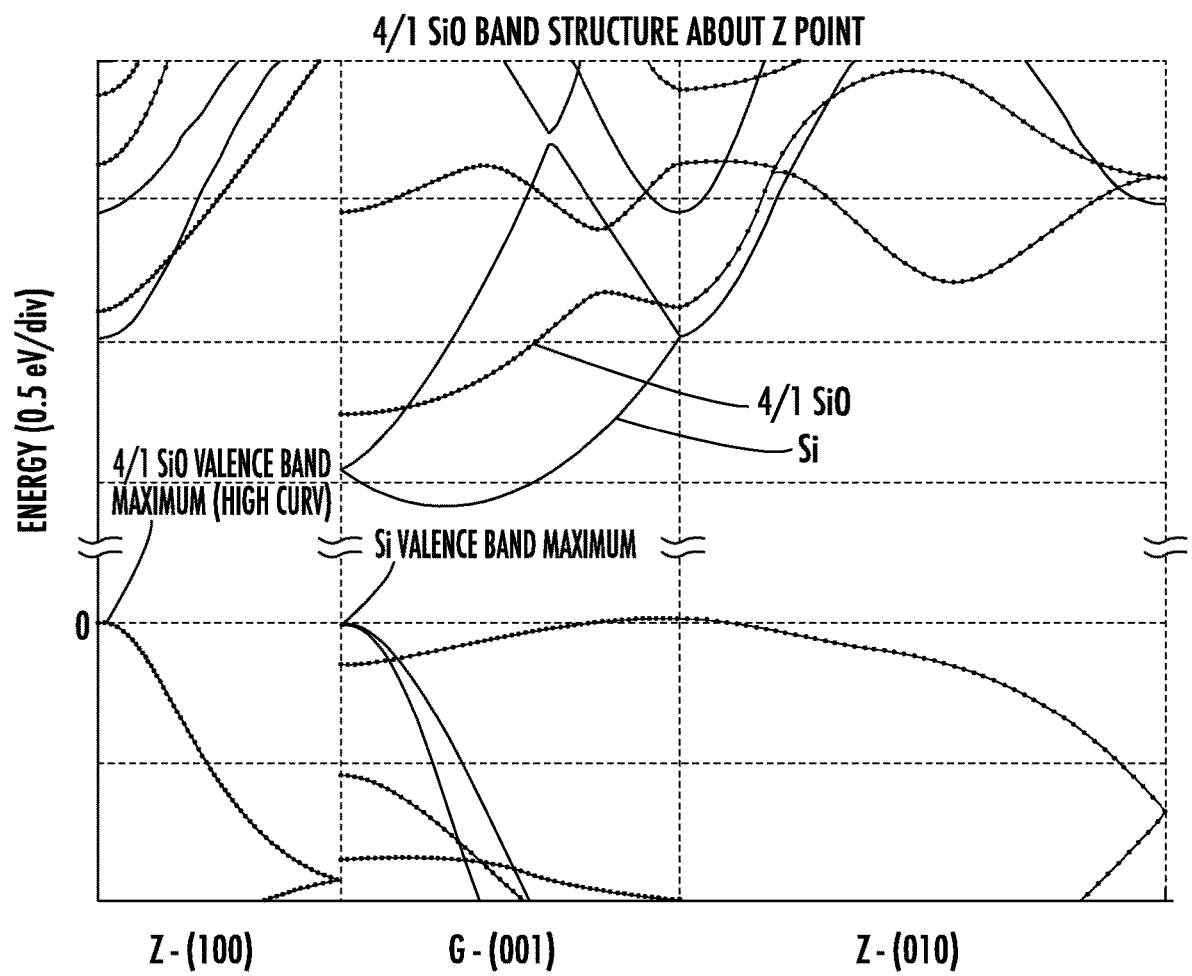
FIG. 4B is a graph of the calculated band structure from the Z point for both bulk silicon as in the prior art, and for the 4/1 Si/O superlattice as shown in FIGS. 1-2.
Figure 4C:
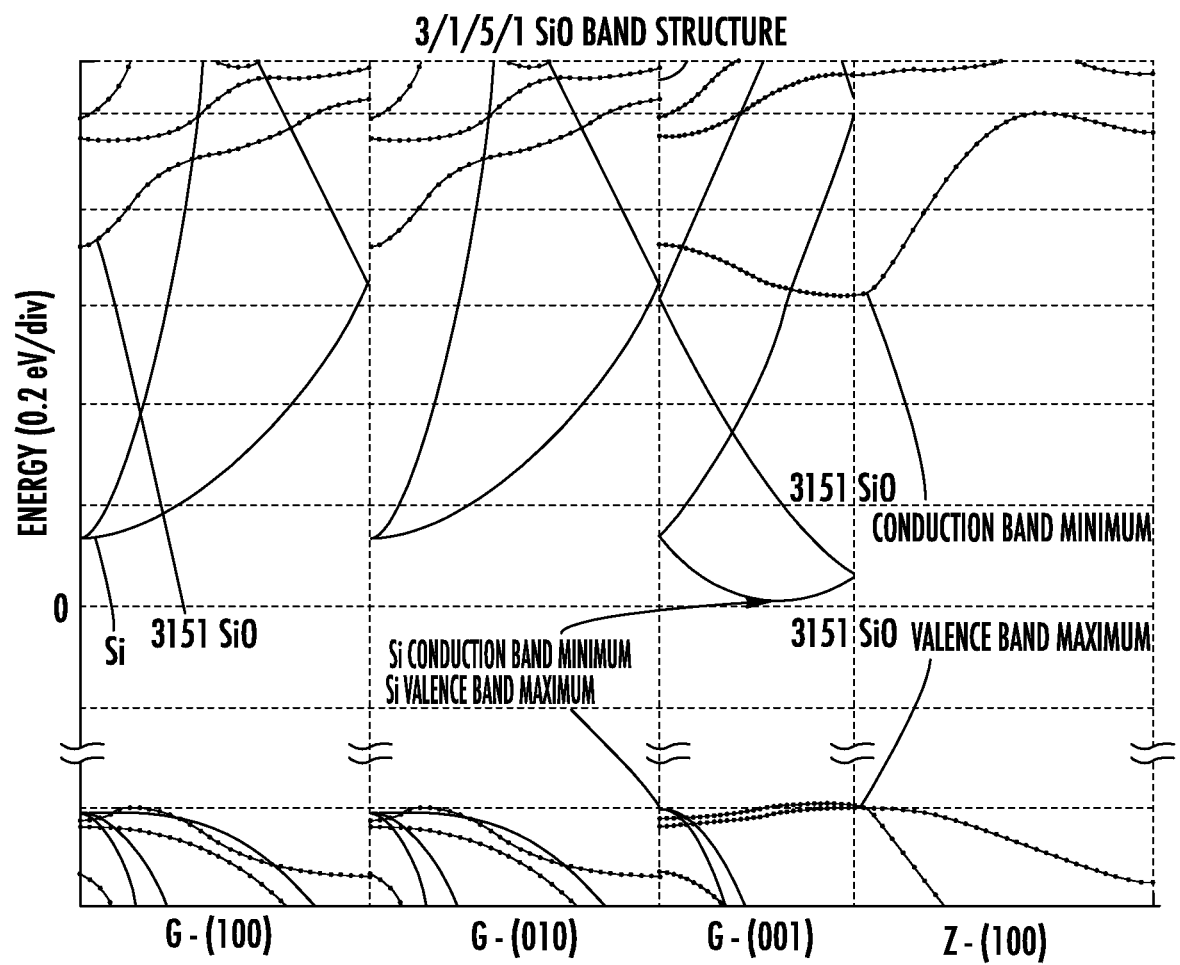
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
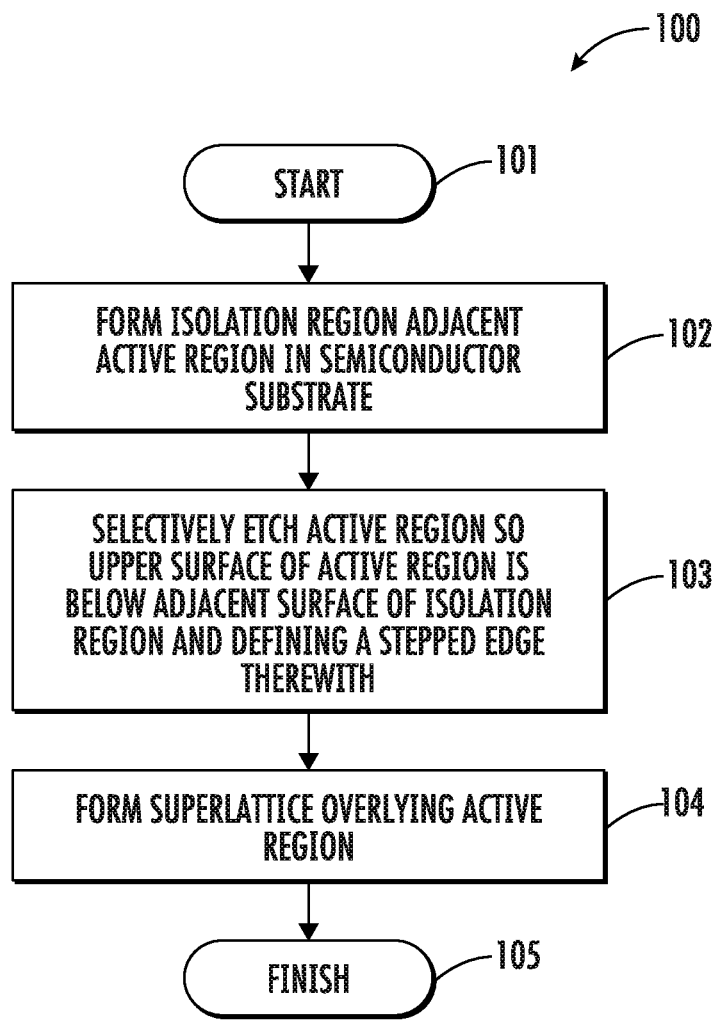
FIG. 5 is a flow diagram illustrating a method for making a semiconductor device including a superlattice using a recess etch process in accordance with an example embodiment.
Figure 6:
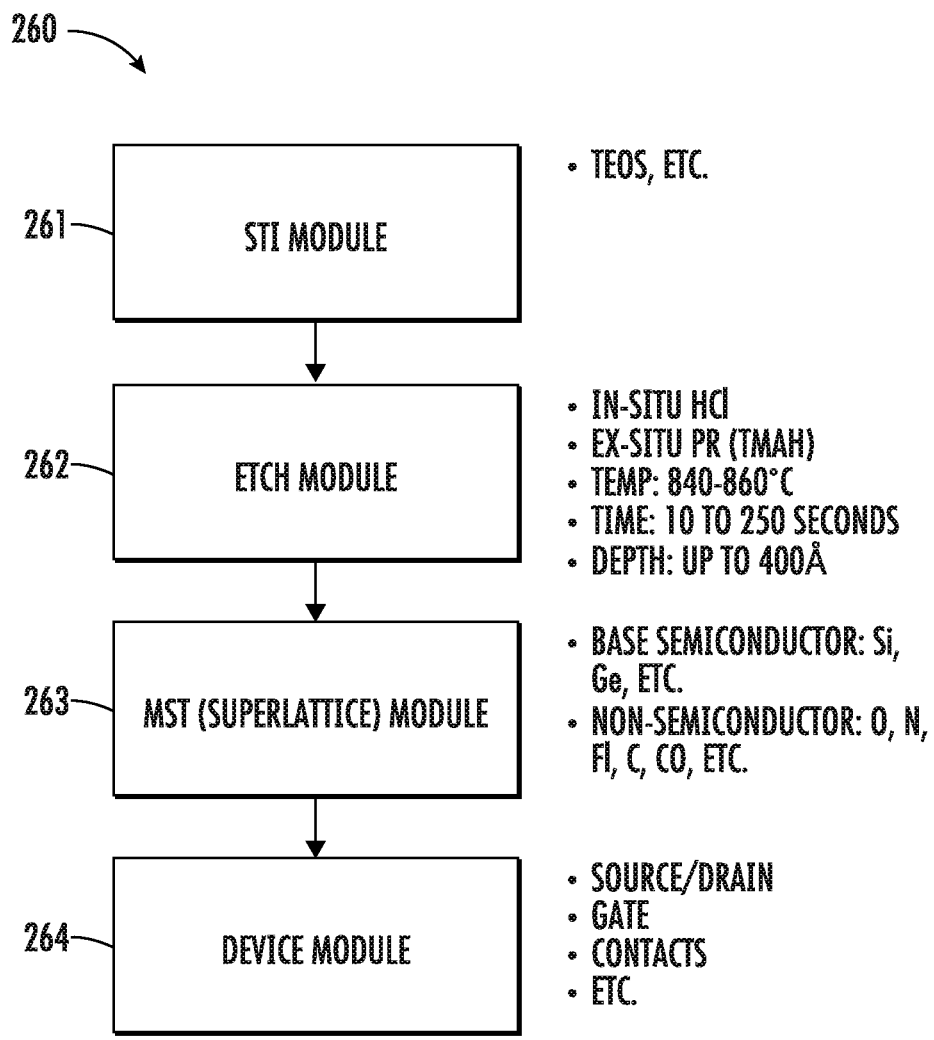
FIG. 6 is a process flow diagram illustrating an example fabrication process flow in accordance with the method illustrated in FIG. 5.
Figure 7:
FIGS. 7-16 are a series of schematic cross-sectional diagrams illustrating example fabrication steps corresponding to the process flow diagram FIG. 6.
Figure 8:
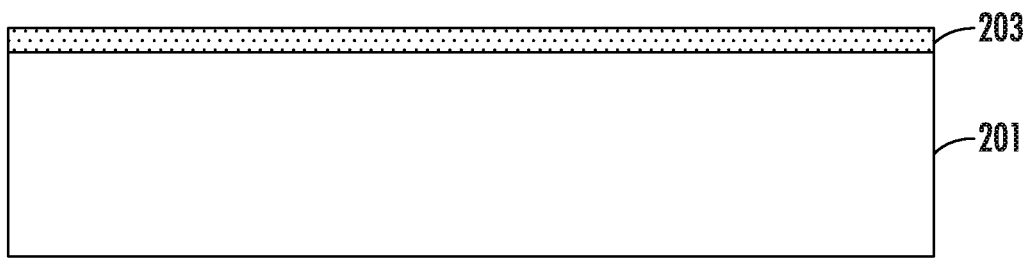
Figure 16:
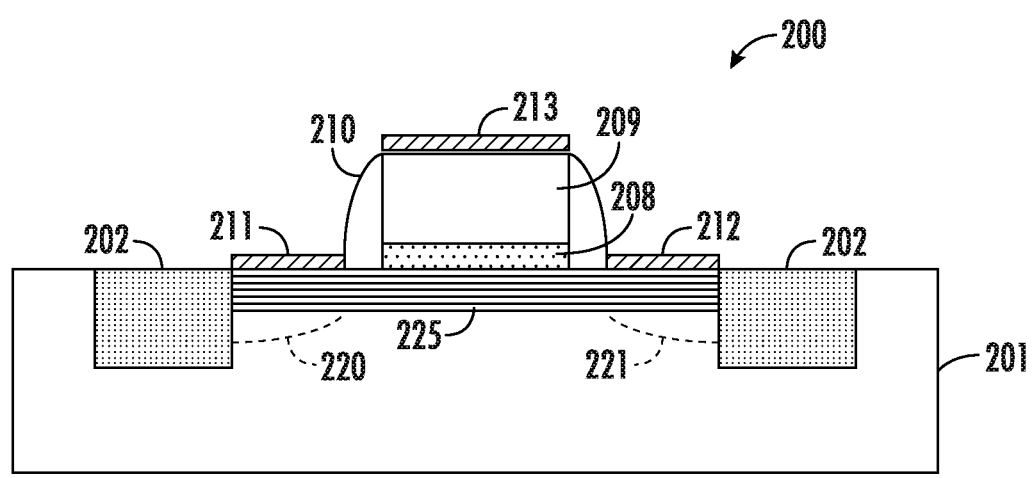

Having described example superlattice structures and fabrication techniques, referring additionally to the flow diagram 100 of FIG. 5 and FIG. 16, an example method for fabricating a semiconductor device 200 is now described. In the illustrated example, the semiconductor device 200 is a planar MOSFET, but other devices may be fabricated using the techniques and MST superlattice structures described herein in other embodiments.

Beginning at Block 101, the method illustratively includes forming an isolation region 202 adjacent an active region in a semiconductor substrate 201, at Block 102. The method further illustratively includes selectively etching the active region so that an upper surface of the active region is below an adjacent surface of the isolation region 202 and defining a stepped edge therewith, at Block 103, and forming a superlattice (such as the MST superlattice structures described above) overlying the active region (Block 104), as will be discussed further below. The method of FIG. 5 illustratively concludes at Block 105.

Figure 9:
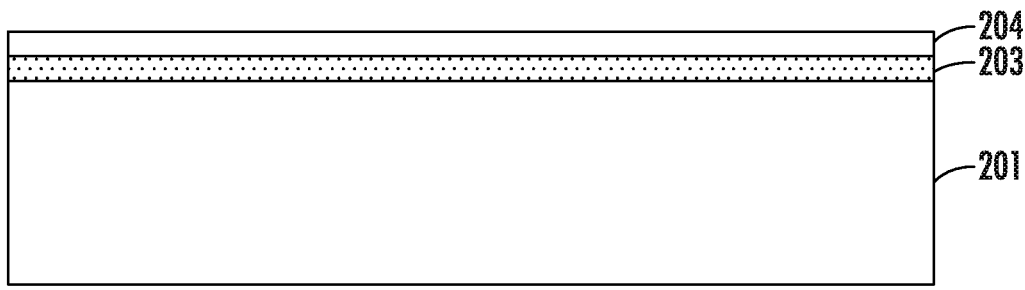
Figure 10:
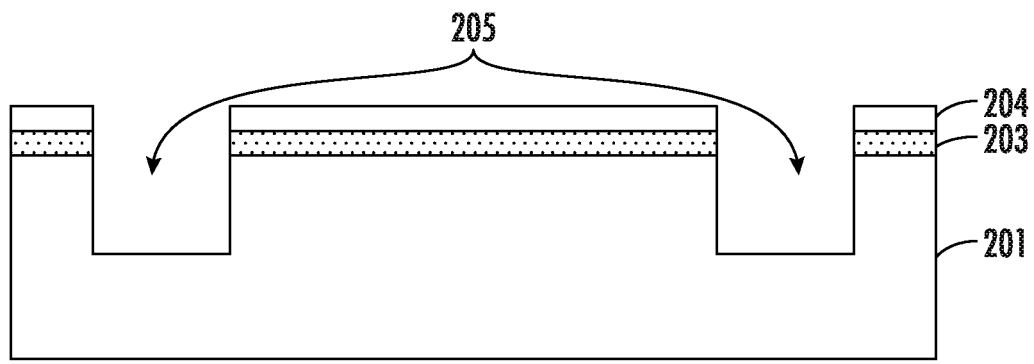
Figure 11:
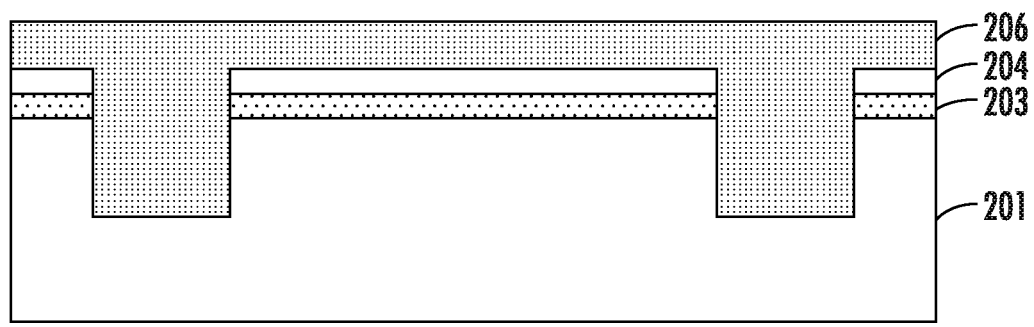
Figure 12:
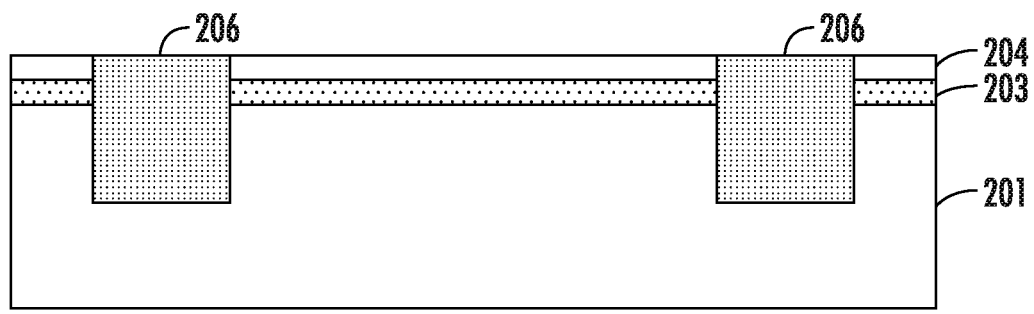
Figure 13:
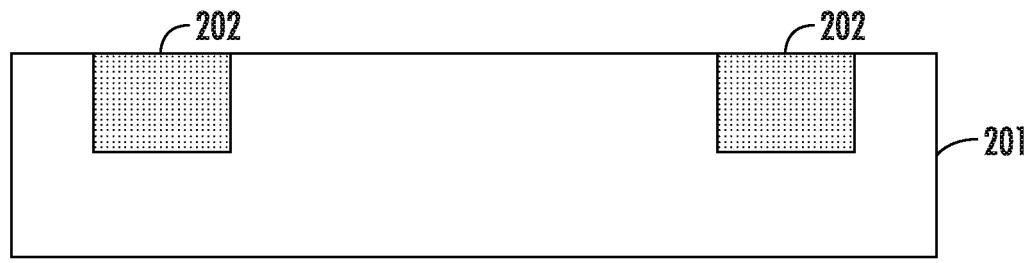
Figure 14:
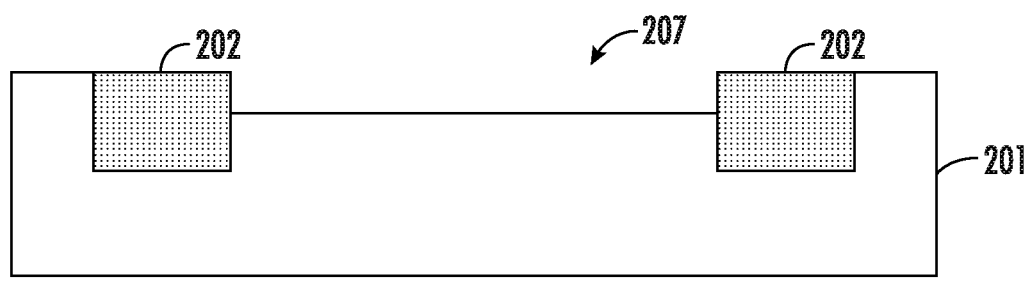

Referring additionally to the process flow diagram 260 of FIG. 6 and FIGS. 7-15, an example process flow for fabricating the device 200 is now described. Formation of the isolation region 202 may be performed through an STI module 261, which corresponds to the fabrication steps illustrated in FIGS. 7-13. More particularly, a pad oxide layer 203 is formed on the semiconductor (e.g., Si, Ge, SiGe, etc.) substrate 201 (FIG. 8), followed by a nitride layer 204 (FIG. 9). Trenches 205 may then be formed through the nitride layer 204, pad oxide layer 203, and into the substrate 201 (FIG. 10), and an oxide layer 206 may subsequently be formed over the remaining portions of the nitride layer 204 and filling the trenches 205 (FIG. 11). In an example implementation, the oxide layer 206 may be a tetraethyl orthosilicate or tetraethoxysilane (TEOS) layer, although other suitable oxides may be used in different embodiments. The oxide layer 206 may be planarized (e.g., by CMP) (FIG. 12), and the nitride layer 204 and pad oxide layer 203 may then be etched away to define the substrate 201 with isolation region 202 therein (FIG. 13). Etching of the pad oxide layer 203 may also reduce a height of the isolation region 202, which is illustratively shown as being flush with the upper surface of the substrate 201 in the illustrated example, but it will be understood that the isolation region may extend above the upper surface of the substrate as well in some embodiments.

An etch module 262 may then be performed by recessing/etching a trench 207 in the substrate 201 within the isolation region 202 (FIG. 14), i.e., in the active area or region of the semiconductor device 200. Generally speaking, the depth of the trench 207 will correspond to a desired thickness of a subsequent superlattice film 225 to be formed within the trench. This may be different depending upon the particular isolation process that is used. By way of example, for some configurations a relatively shallow etch (e.g., on the order of 25 Å or less, and more particularly 15 Å or less) may be performed. One example process to define a ~15 Å trench 207 in a silicon substrate 201 was performed utilizing an HCl etch at temperature of 850° C. and pressure of 40 Torr for 10 seconds. Generally speaking, etching may be performed in a temperature range of 700 to 850° C., a pressure range from 30 Torr to 1 atmosphere (and more particularly from 40 to 300 Torr), and for a duration of up to 300 seconds for etch rates of 1 to 5 Angstroms/second, although different values and etching times may be used in different configurations, as will be discussed further below.

In accordance with another example embodiment, a deep recess etching process may be used. In one example implementation, an HCl etch in a silicon substrate was performed at a temperature of 850° C. and a pressure of 40 Torr for a duration of 218 seconds, providing an etch depth of ~400 Å. Generally speaking, the depth of the etch is controlled to create the desired step or sidewall height with respect to the isolation region 202, so that the step will act as a barrier to confine lateral growth of the superlattice 225 as it is formed. This advantageously helps define a desired active edge profile, which in turn may be important for proper device performance, as will be appreciated by those skilled in the art. Active edge profile is important to avoid sharp corners, which lead to enhanced fields and subsequent gate leakage. Divot formation can result in parallel (parasitic) devices with resulting non-ideal I-V transistor curves (kinks) and performance degradation.

While the present example is being described with respect to an STI process, in some embodiments other approaches may be used for forming the isolation region 202 as well, such as a Local Oxidation of Silicon (LOCOS) approach. Both shallow and deep recess etches may be performed when using a LOCOS approach as well, similar to those described above with respect to STI. In one example implementation using LOCOS, a ~200 Å trench was etched in a silicon substrate at a temperature of 850° C. and a pressure of 40 Torr for a duration of 218 seconds.

It should be noted that other etching approaches and etchants may be used besides in-situ HCl. One such approach is an ex-situ process utilizing a wet etch photoresist developer. For example, one such photoresist developer may include tetramethylammonium hydroxide (TMAH). TMAH is used in liquid form with temperatures in a range of 10-90° C., and more particularly around room temperature or elevated to 65 C to speed up the reaction. In an example implementation, a photoresist developer including 2.5% TMAH and a surfactant was used and found to provide relatively flat etch surfaces, particularly near the step defined with the isolation region 202. This approach may also be used in a manner similar to those described above to provide desired shallow or deep etch depths.

Figure 15:
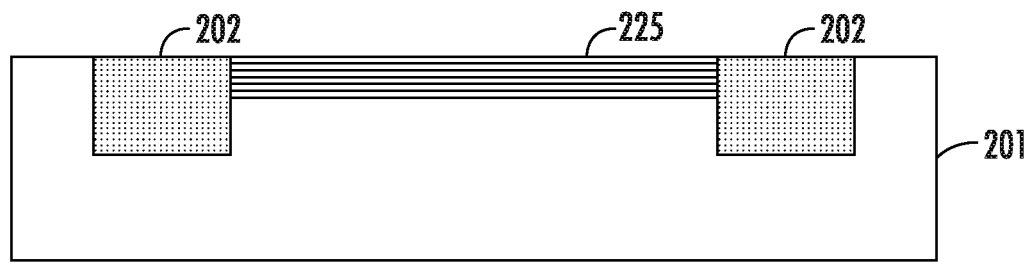

Once the etch module 262 is complete, the superlattice layer 225 may then be formed in an MST module 263 to define a superlattice material layer as described further above (FIG. 15). Thereafter, a device module 264 may be performed to create the final semiconductor device 200 (which is a MOSFET in the present example). The device module 264 may include gate formation over the superlattice layer 225, which illustratively includes a gate insulator 208 (e.g., $SiO_2$, etc.) and a gate electrode 209 (e.g., polysilicon, metal, etc.). Sidewall spacers 210 are formed adjacent the gate, and source/drain regions 220, 221 are formed defining a channel therebetween in the superlattice layer 225 in the present example (although some or all of the channel may be outside the superlattice layer in some embodiments). Furthermore, respective source, drain, and gate contacts 211, 212, 213 (e.g., silicide) are also formed, as will be appreciated by those skilled in the art. As noted previously, the above-described recess etch approach may be used in the formation of other semiconductor devices as well in different embodiments.

The recess etch approach set forth herein advantageously helps confine lateral growth of the superlattice 225 within the stepped edge of the trench 207 to thereby prevent overflows onto the isolation region, which degrades the active edge geometry and may lead to performance issues. In some embodiments, a heat treatment may be performed after the formation of the superlattice layer 225 to contract the superlattice material, but care should be taken when doing so as excessive heating may result in a degradation of the MST film and undesirable dislocation of the non-semiconductor material from within the crystal lattice of adjacent semiconductor atoms.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming an isolation region adjacent an active region in a semiconductor substrate;
    selectively etching the active region so that an upper surface of the active region is below an adjacent surface of the isolation region and defining a stepped edge therewith; and
    forming a superlattice overlying the active region, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 wherein forming the superlattice comprises forming the superlattice to a height of the stepped edge.

3. The method of claim 1 wherein etching comprises in-situ etching with an HCl etchant.

4. The method of claim 1 wherein etching comprises etching for a period in a range of 10 to 250 seconds.

5. The method of claim 1 wherein etching comprises etching to a depth of less than or equal to 400 Å.

6. The method of claim 1 wherein etching comprises ex-situ etching with a wet etch comprising a photoresist developer.

7. The method of claim 6 wherein the photoresist developer comprises tetramethylammonium hydroxide (TMAH).

8. The method of claim 1 wherein etching comprises etching at a temperature in a range of 840-860° C.

9. The method of claim 1 further comprising forming spaced-apart source and drain regions on the semiconductor substrate with the superlattice defining a channel therebetween, and a gate overlying the superlattice.

10. The method of claim 1 wherein the base semiconductor monolayers comprise silicon monolayers.

11. The method of claim 1 wherein the at least one non-semiconductor monolayer comprises oxygen.

12. The method of claim 1 wherein the base semiconductor monolayers comprise germanium.

13. The method of claim 1 wherein the at least one non-semiconductor monolayer comprises at least one of oxygen, nitrogen, fluorine, carbon and carbon-oxygen.

14. A method for making a semiconductor device comprising:
    forming an isolation region adjacent an active region in a semiconductor substrate;
    selectively etching the active region so that an upper surface of the active region is below an adjacent surface of the isolation region and defining a stepped edge therewith; and
    forming a superlattice overlying the active region to a height of the stepped edge, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions; and
    forming spaced-apart source and drain regions on the substrate with the superlattice defining a channel therebetween, and a gate overlying the superlattice.

15. The method of claim 14 wherein etching comprises in-situ etching with an HCl etchant.

16. The method of claim 14 wherein etching comprises etching to a depth of less than or equal to 400 Å.

17. The method of claim 14 wherein etching comprises ex-situ etching with a wet etch comprising a photoresist developer.

18. The method of claim 14 wherein etching comprises etching at a temperature in a range of 840-860° C.

19. The method of claim 14 wherein the base semiconductor monolayers comprise silicon monolayers, and the at least one non-semiconductor monolayer comprises oxygen.

20. A method for making a semiconductor device comprising:
    forming an isolation region adjacent an active region in a semiconductor substrate;
    selectively etching the active region so that an upper surface of the active region is below an adjacent surface of the isolation region and defining a stepped edge therewith; and
    forming a superlattice overlying the active region, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions.

21. The method of claim 20 wherein forming the superlattice comprises forming the superlattice to a height of the stepped edge.

22. The method of claim 20 wherein etching comprises in-situ etching with an HCl etchant.

23. The method of claim 20 wherein etching comprises etching to a depth of less than or equal to 400 Å.

24. The method of claim 20 wherein etching comprises ex-situ etching with a wet etch comprising a photoresist developer.

* * * * *